United States Patent
Yang et al.

(10) Patent No.: US 7,626,871 B1
(45) Date of Patent: Dec. 1, 2009

(54) HIGH-SPEED SINGLE-ENDED MEMORY READ CIRCUIT

(75) Inventors: Ge Yang, Pleasanton, CA (US);
Hwong-Kwo (Hank) Lin, Palo Alto, CA (US); Charles Chew-Yuen Young, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 82 days.

(21) Appl. No.: 11/952,085

(22) Filed: Dec. 6, 2007

Related U.S. Application Data

(60) Provisional application No. 60/954,957, filed on Aug. 9, 2007.

(51) Int. Cl.
*G11C 7/00* (2006.01)
(52) U.S. Cl. .............. 365/189.15; 365/154; 365/189.06
(58) Field of Classification Search ............ 365/189.15, 365/189.05, 189.08, 154, 156, 203, 189.06
See application file for complete search history.

(56) References Cited

U.S. PATENT DOCUMENTS

| | | | | |
|---|---|---|---|---|
| RE33,694 E | * | 9/1991 | McElroy ..................... | 365/149 |
| 5,646,893 A | * | 7/1997 | McMinn et al. ........ | 365/189.05 |
| 6,014,338 A | * | 1/2000 | Wang et al. .................. | 365/205 |
| 6,320,795 B1 | * | 11/2001 | Balamurugan et al. . | 365/189.08 |
| 7,016,239 B2 | * | 3/2006 | Chatterjee et al. ...... | 365/189.12 |

* cited by examiner

*Primary Examiner*—Gene N. Auduong
(74) *Attorney, Agent, or Firm*—Patterson & Sheridan, LLP

(57) ABSTRACT

One embodiment of the present invention sets forth a high-speed single-ended memory read circuit that overcomes performance limitations of conventional single ended memory read circuits. A bit line keeper control mechanism for the high-speed single-ended memory read circuit is disclosed that automatically configures the bit line keeper for high-speed operation or low-speed operation, based on the frequency of a system clock. In high-speed operation, the bit line keeper is disabled, thereby eliminating short-circuit currents related to the bit line keeper and increasing the read performance of the single-ended memory read circuit. In low-speed operation, the bit line keeper is periodically disabled by a timer circuit to enable efficient read or write operations. Subsequent to the read or write operation, the bit line keeper is enabled to preserve state on the bit lines. By selectively enabling the bit line keeper, high-speed performance is improved while preserving correct function at low speeds.

24 Claims, 12 Drawing Sheets

HIGH-SPEED SINGLE-ENDED MEMORY READ CIRCUIT

CROSS-REFERENCE TO RELATED APPLICATIONS

This application claims benefit of U.S. provisional patent application Ser. No. 60/954,957, filed Aug. 9, 2007, which is herein incorporated by reference.

BACKGROUND OF THE INVENTION

1. Field of the Invention

Embodiments of the present invention relate generally to integrated circuit memory read circuits and more specifically to a high-speed single-ended memory read circuit design.

2. Description of the Related Art

Integrated circuits frequently employ various common system building block circuits, such as logic gates and memories blocks, to construct the overall system functionality of a given integrated circuit. Each type of system building block circuit is usually optimized for a given criterion, such as operating speed, power consumption, or die area. Furthermore, architecturally distinct designs may be selected to meet specific optimization criteria. For example, a high-speed memory block that is optimized for operating speed typically incorporates a differential access regime, whereby each memory cell within a storage cell array of memory cells is read and written using a differential pair of bit lines. This differential access regime requires two bit lines per access port, per column of bits. While the differential access regime enables increased operating speed, the additional bit line per access port increases the overall die area of this type of design. Alternately, a high-density memory block that is optimized for die area may use a single-ended access regime, whereby each memory cell within the storage cell array of memory cells is read and written using a single bit line rather then a differential pair of bit lines. While the single-ended access regime requires less die area, the performance of this type of design typically suffers due to performance limitations in conventional single-ended memory read circuits.

High operating speeds are a common requirement in integrated circuits; however, minimizing die area is also an important requirement because die area directly impacts the cost of manufacturing integrated circuits. In certain applications, the smaller die area of a single-ended bit line memory block is highly desirable versus a differential bit line memory block. However, in such applications, the operating speed of a conventional single-ended bit line memory block may not be sufficient due to limitations in conventional single-ended memory read circuits. As a result, differential bit line memory blocks are used instead to satisfy higher operating speed requirements. In these applications, the additional die area required by differential bit line memory blocks results in increased die area and increased overall cost.

As the foregoing illustrates, to optimize speed and die area, what is needed in the art is a high-speed single-ended memory read circuit.

SUMMARY OF THE INVENTION

One embodiment of the present invention sets forth a high-speed single-ended memory read circuit. The memory read circuit includes a pre-charge circuit configured to pull up a first bit line and a second bit line in response to a pre-charge control signal, a bit keeper circuit configured to maintain a high state whenever the first bit line or the second bit line is in a high state, and a column select circuit configured to select either the first bit line or the second bit line to drive an output node located within the column select circuit to produce a single bit of read data.

One advantage of the disclosed memory read circuit is that, in high-speed operation, a bit line keeper may be disabled, thereby eliminating short-circuit currents related to the bit line keeper and increasing the read performance of the single-ended memory read circuit. In low-speed operation, the bit line keeper may be periodically disabled by a timer circuit to enable efficient read or write operations. Subsequent to the read or write operation, the bit line keeper may be enabled to preserve state on the bit lines. By selectively enabling the bit line keeper, high-speed performance is improved while preserving correct function at low speeds.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
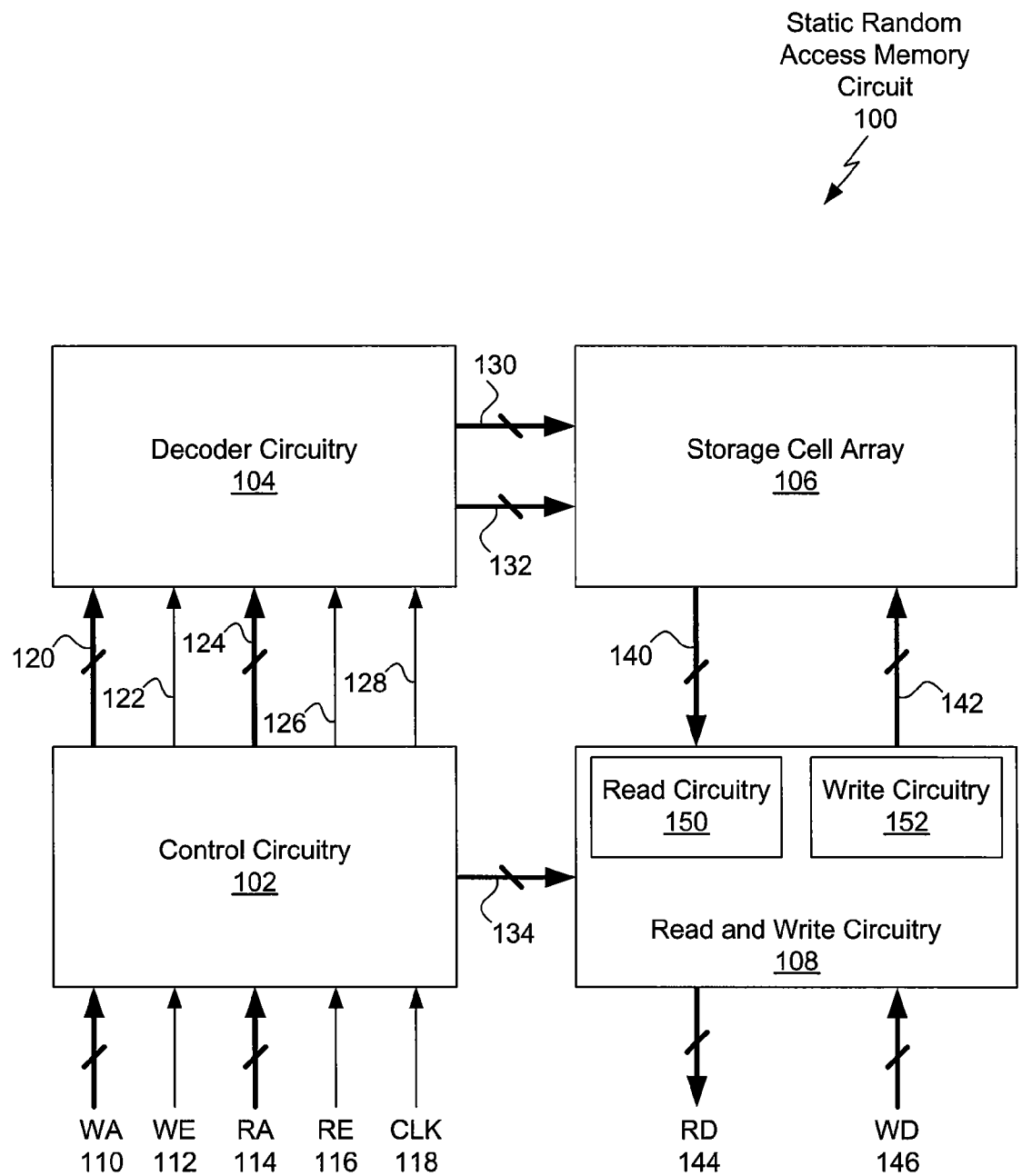
FIG. 1 illustrates the architecture of a static random access memory circuit, according to one embodiment of the invention.

FIG. 1 illustrates the architecture of a static random access memory (SRAM) circuit 100, according to one embodiment of the invention. The SRAM circuit includes control circuitry 102, a decoder circuitry 104, a storage cell array 106, and read and write circuitry 108. The SRAM circuit 100 includes input/output ports for at least one write address (WA) 110, write enable (WE) 112, read address (RA) 114, read enable (RE) 116, clock (CLK) 118, read data (RD) 144, and write data (WD) 146.

The control circuitry 102 receives the address (WA) 110, write enable (WE) 112, read address (RA) 114, read enable (RE) 116 and the clock (CLK) 118 and generates output signals to the decoder circuitry 104 and the read and write circuitry 108. The control circuitry 102 generates control signals 134 for controlling the read and write circuitry 108. The control signals 134 include, for example, timing pulses used to pre-charge, initiate a read, or initiate a write operation. The control signals 134 may also include selector bits, typically derived from WA 110 or RA 114 bits, which are used to select between bit lines in the read circuitry 150 and write circuitry 152, within the read and write circuitry 108. The control circuitry 102 also generates write address bits 120, one or more write enable bit 112, read address bits 124, one or more read enable bit 126, and a control clock 128. In one embodiment, one or more least significant address bits from each of WA 110 and RA 114 are used to generated control signals 134, while the remaining upper address bits from WA 110 and RA 114 are used to generate address bits 120 and 124, respectively.

The decoder circuitry 104 decodes write address bits 120 into a set of word lines 130, whereby one unique word line may be enabled for each code available on address bits 120. For example, if address bits 120 includes eight bits, then a possible 2^8 (or 256) word lines 130 may be decoded by decoder circuitry 104. Write enable 122 gates the word lines 130. In a similar way, read address bits 124 are decoded into word lines 132, which are enabled by read enable 126. A control clock 128 may be used to provide further gating or decoding, as required by the specific implementation. Word lines 130 and 132 operate substantially identically, providing independently decoded word lines from independent input addresses. In one embodiment, only one set of word lines 130 is required, wherein the word lines 130 are shared for both read and write operations.

The storage cell array 106 includes an array of at least one memory cell used to store data. Data is written to the memory cell when an associated word line within word lines 130 selects the row containing the memory cell and one or more associated bit lines 142 are driven by write circuitry 152 with a data value to be written. An entire row is typically selected, and one or more bits within the row may be written by a write operation. The data is read from the memory cell when an associated word line within word lines 132 selects the row containing the memory cell and the associated bit lines 140 are read by read circuitry 150. An entire row is typically selected, and one or more bits may be read by a read operation.

The read and write circuitry 108 is coupled to bit lines 140, used for reading data within the storage cell array 106, and bit lines 142, used for writing data within the storage cell array 106. The read circuitry 150 reads data on bit lines 140 and drives the data on output RD 144. The write circuitry 152 receives data on the input WD 146 and drives the data on bit lines 142, when the control bits 134 initiate a write operation. In one embodiment, bit lines 140 and 142 may be one set of shared bit lines, used for both reading and writing.

Figure 2:
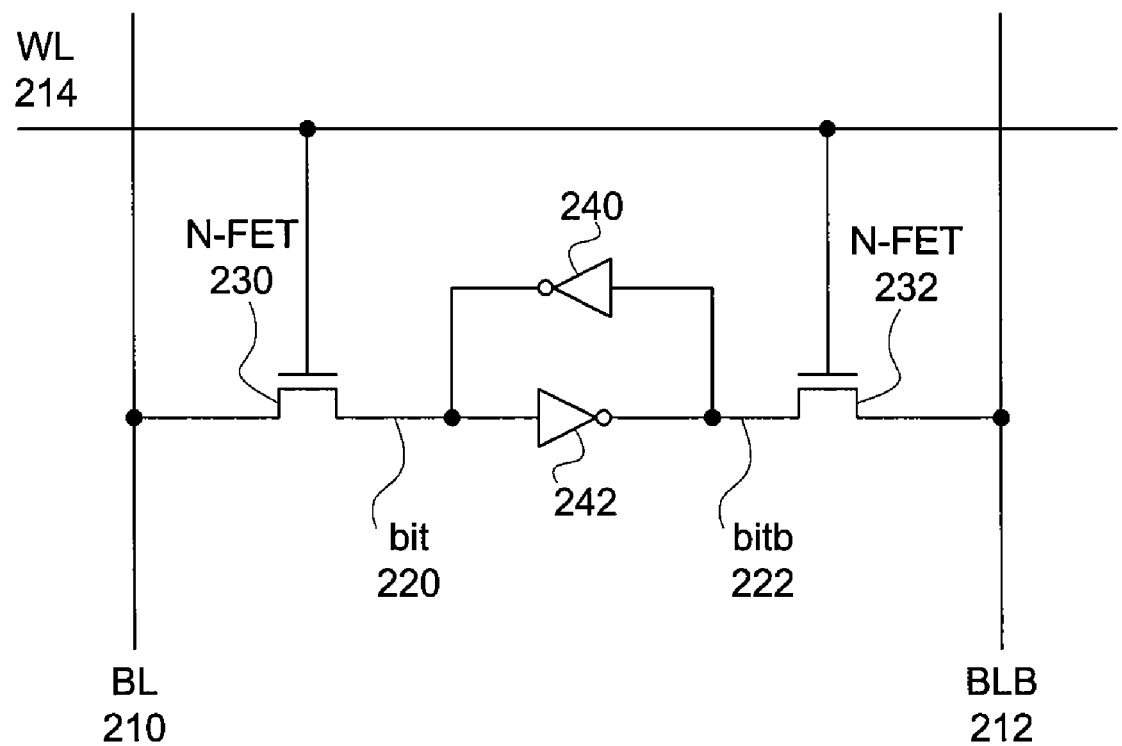
FIG. 2 illustrates a six-transistor static random access memory cell, according to one embodiment of the invention.

FIG. 2 illustrates a six-transistor static random access memory cell 200, according to one embodiment of the invention. The SRAM cell 200 includes two inverters 240, 242 configured to form a cross-coupled latch, whereby bit 220 represents the positive sense of the bit stored within the latch and bitb 222 represents the negative (inverted) sense of the bit stored within the latch. Word line (WL) 214 is coupled to the gate node of N-channel field-effect transistor (N-FET) 230 and N-FET 232. When WL 214 is low (logic "0"), N-FETs 230 and 232 are turned off, decoupling bit 220 and bitb 222 of the latch from bit line (BL) 210 and bit line-bar (BLB) 212, respectively. When WL 214 is high (logic "1"), N-FETs 230 and 232 are turned on, thereby coupling bit 220 and bitb 222 of the latch to bit line (BL) 210 and bit line-bar (BLB) 212, respectively. During a read operation, read circuitry 150 of FIG. 1 senses the voltage on BL 210 and drives the value to RD 144. During a write operation, write circuitry 152 receives data from WD 146, and uses the data to potentially overpower the latch by forcing a value on BL 210. Alternately, the write circuitry 152 may drive a bit line dedicated for write data.

Figure 3A:
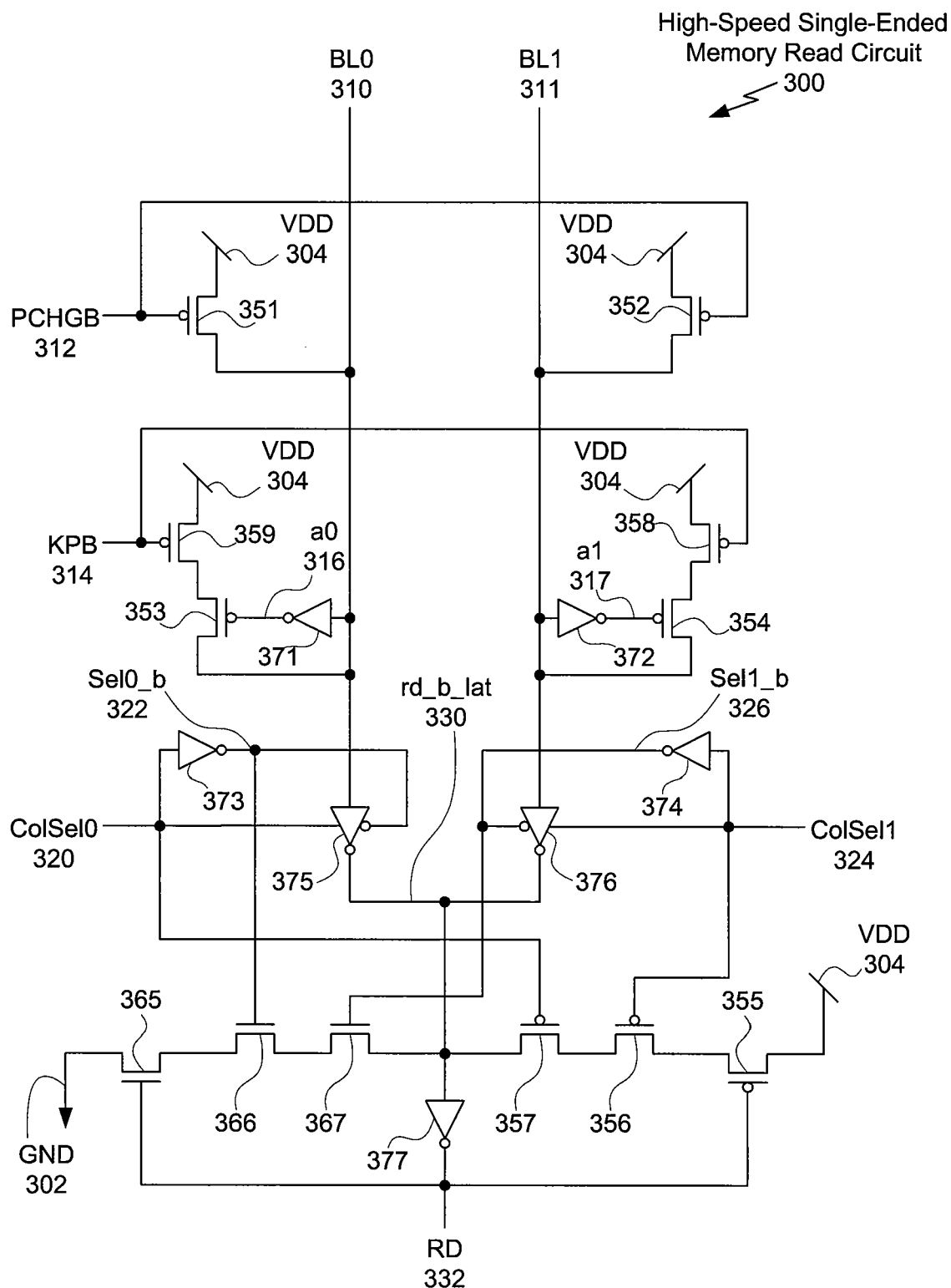
FIG. 3A illustrates a high-speed single-ended memory read circuit, according to one embodiment of the invention.

FIG. 3A illustrates a high-speed single-ended memory read circuit 300, according to one embodiment of the invention. The high-speed single-ended memory read circuit 300 includes a pre-charge circuit, a bit keeper circuit, a column select circuit, and an output latch circuit.

The pre-charge circuit includes P-channel field-effect transistor (P-FET) 351 and P-FET 352. When the pre-charge-bar (PCHGB) 312 input is high (disabled), P-FETs 351 and 352 are turned off, decoupling VDD 304 from BL0 310 and BL1 311 through P-FETs 351 and 352. When PCHGB 312 is low (enabled), P-FETs 351 and 352 are turned on, causing BL0 310 and BL1 311 to be pulled to VDD 304 through P-FETs 351 and 352.

The bit keeper circuit includes P-FETs 353, 354, 358, and 359, as well as inverters 371 and 372. When the keeper control signal, KPB 314 is low (enabled), P-FETs 358 and 359 are turned on, allowing the bit keeper circuit to selectively pull BL0 310 or BL1 311 up to VDD 304. When KPB 314 is low and BL0 310 is high, inverter 371 drives node a0 316 low, which turns on P-FET 353, thereby creating a pull-up path from BL0 310 to VDD 304 via P-FET 353 and 359. This pull-up path keeps BL0 310 in a high state. When KPB 314 is low and BL0 310 is low, inverter 371 drives node a0 316 to high, which turns off P-FET 353, disabling the pull-up path from BL0 310 to VDD 304, allowing BL0 to remain driven low without the influence of the pull-up path. Similarly, when KPB 314 is low and BL1 311 is high, inverter 372 drives node a1 317 low, which turns on P-FET 354, thereby creating a pull-up path from BL0 311 to VDD 304 via P-FET 354 and 358. This pull-up path keeps BL1 311 in a high state. When KPB 314 is low and BL1 311 is low, inverter 372 drives node a1 317 to high, which turns off P-FET 354, disabling the pull-up path from BL1 311 to VDD 304, allowing BL1 to remain driven low without the influence of the pull-up path.

When KPB 314 is high (disabled), P-FETs 358 and 359 are turned off, disabling the bit keeper circuit from driving either BL0 310 or BL1 311. With the bit keeper circuit disabled, BL0 310 or BL1 311 may be pulled down by a selected storage cell, for example via N-FET 230 of storage cell 200 in FIG. 2, without the influence of a pull-up current generated by the bit-keeper circuit. During a read operation, disabling the bit keeper circuit allows the storage cell 200 to more quickly drive BL0 310 or BL1 311 to a low state, enhancing the operating speed of the over all SRAM circuit 100.

The column select circuit includes inverters 373 and 374, and gated inverters 375 and 376. The column select circuit receives inputs BL0 310, BL1 311, column select 0 (ColSel0) 320, and column select 1 (ColSel1) 324. The column select circuit generates three outputs, inverted column select 0 (Sel0_b 322), inverted column select 1 (Sel1_b 326), and an inverted version of read data to be latched (rd_b_lat) 330. The column select circuit transmits the three output signals Sel0_b 322, Sel1_b 326, rd_b_lat 330, as well as ColSel0 320 and ColSel1 324 to the output latch circuit.

Inverter 373, within the column select circuit, generates Sel0_b 322, which, in conjunction with SelSel0 320, controls gated inverter 375. When ColSel0 320 is high, gated inverter 375 is enabled, which causes gated inverter 375 to drive rd_b_lat 330 with an inverted version of the logic state on input BL0 310. For example, when ColSel0 is high, and BL0 310 is high, rd_b_lat 330 is driven low by gated inverter 375. Alternately, when ColSel0 is high and BL0 310 is low, rd_b_lat 330 is driven high by gated inverter 375. Similarly, when ColSel1 324 is high, gated inverter 376 is enabled, which causes gated inverter 376 to drive rd_b_lat 330 with an inverted version of the logic state on input BL1 311. In normal operation, ColSel0 320 and ColSel1 324 are not driven high simultaneously. In fact, during normal operation either ColSel0 320 or ColSel1 324 is pulsed to enable read data to flow from either BL0 310 or BL1 311 to rd_b_lat 330. When both ColSel0 320 and ColSel1 324 are low (disabled), rd_b_lat 330 is driven by the output latch circuit.

The output latch circuit includes N-FETs 365, 366, 367, P-FETs 355, 356, 357, and inverter 377. N-FETs 365, 366, and 367 along with P-FETs 355, 356, and 357 form a gated inverter, which is cross-coupled with inverter 377. The gated inverter along with inverter 377 form an output latch, with output node RD 332. When either ColSel0 320 or ColSel1 324 are high, the gated inverter is disabled, allowing any state driven on rd_b_lat 330 to be buffered and driven to output RD 332 by inverter 377. When both ColSel0 320 and ColSel1 324 are low, the gated inverter within the output latch circuit is enabled, completing a stable feedback loop from the output value on RD 332, through to gated inverter, and back to rd_b_lat 330. Detailed signal timing is presented below in FIGS. 4A through 4D.

Figure 3B:
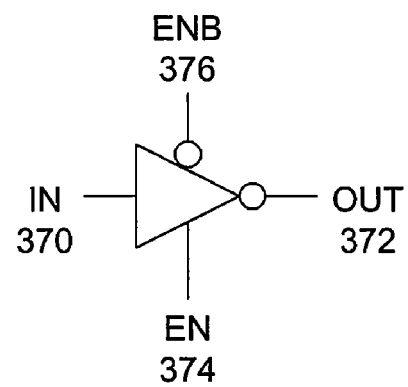
FIG. 3B depicts a gated inverter, according to one embodiment of the invention.

FIG. 3B depicts a gated inverter, according to one embodiment of the invention. The gated inverter includes a data input, IN 370, and a data output, OUT 372. The gated inverter also includes two control signals, EN 374 and ENB 376. When EN 374 is driven high, ENB 376 should be driven low. When EN 374 is driven low, ENB 376 should be driven high. When EN 374 is high (and therefore, ENB 376 is low), the gated inverter is enabled and drives OUT 372 with an inverted version of IN 370. When EN 374 is low (and therefore, ENB 376 is high), OUT 372 is allowed to float. This gated inverter behavior may be applied to gated inverters 375 and 376 of FIG. 3A.

Figure 3C:
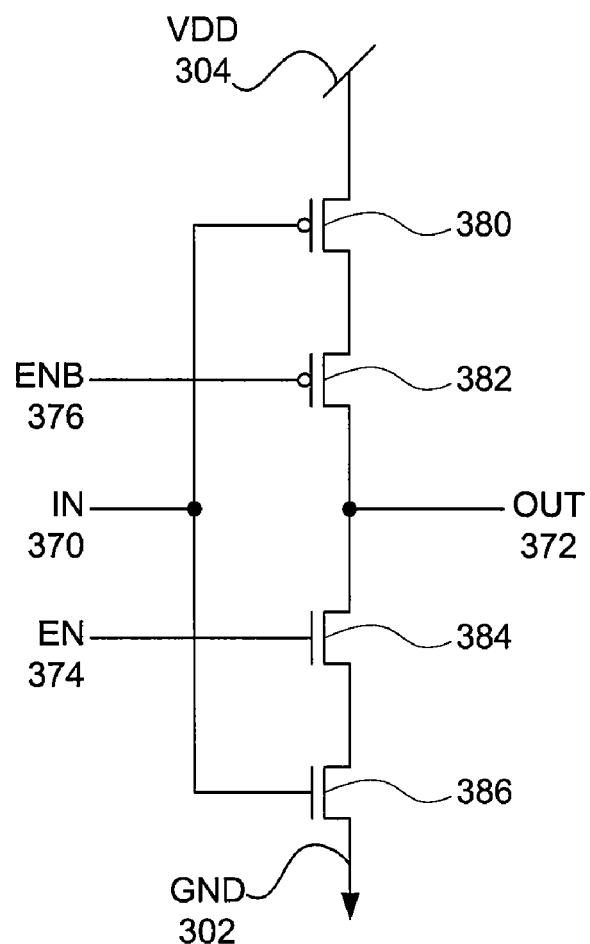
FIG. 3C illustrates a circuit level implementation of the gated inverter, according to one embodiment of the invention.

FIG. 3C illustrates a circuit level implementation of the gated inverter, according to one embodiment of the invention. The gated inverter includes two P-FETs 380, 382 and two N-FETs 384, 386. The P-FETs form a pull-up path from OUT 372 to VDD 304 when both IN 370 and ENB 376 are low. The N-FETs form a pull-down path from OUT 372 to GND 302 when both EN 374 and IN 370 are high. When EN 374 is low and ENB 376 is high, then OUT 372 is left to float. In one embodiment, this circuit level implementation of a gated inverter is used to implement gated inverters 375 and 376 of FIG. 3A.

Figure 4A:
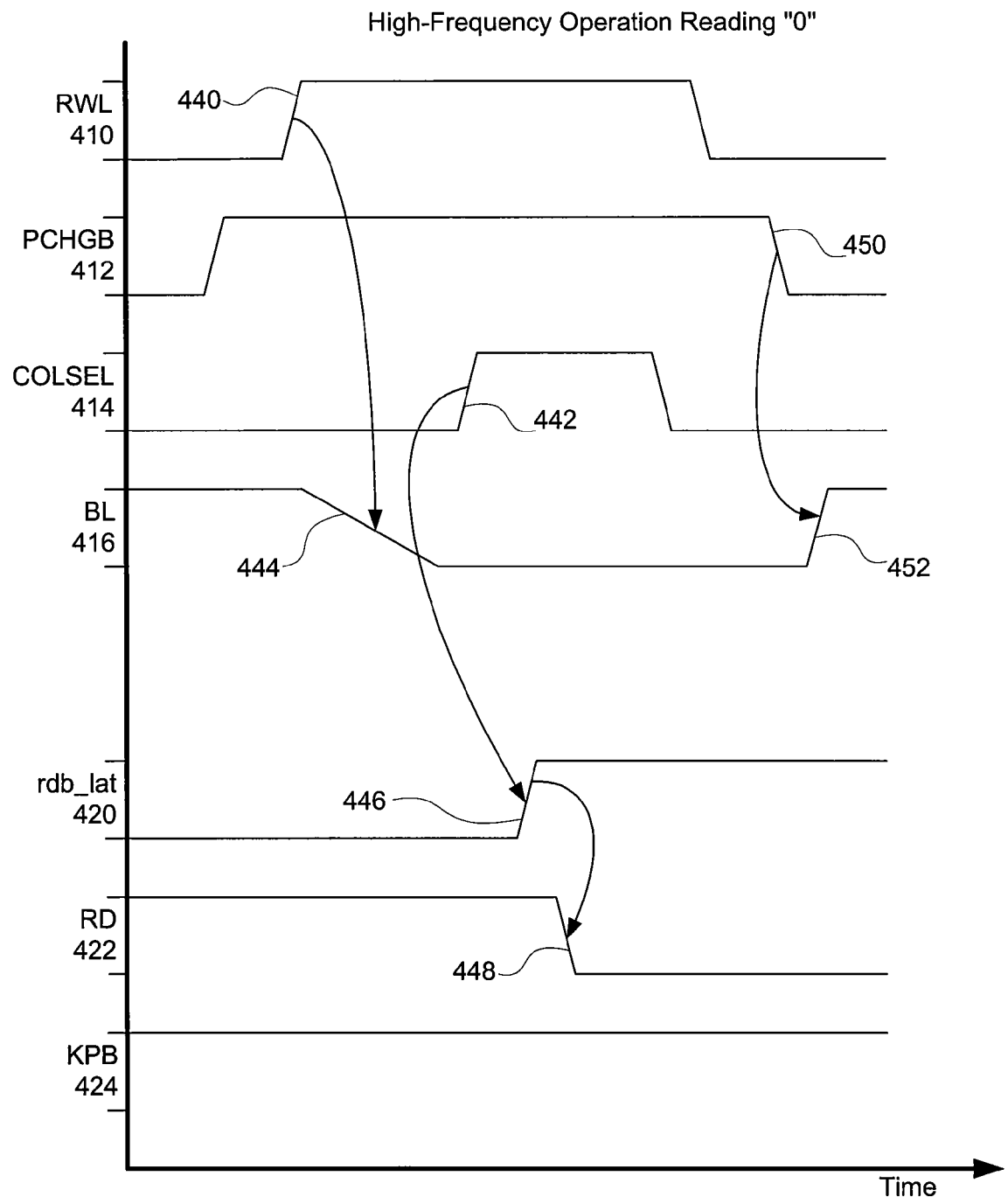
FIG. 4A depicts the operation of the high-speed single-ended memory read circuit operating in high-frequency mode while reading a "0," according to one embodiment of the invention.

FIG. 4A depicts the operation of the high-speed single-ended memory read circuit 300 operating in high-frequency (e.g., 500 MHz) mode while reading a "0," according to one embodiment of the invention. When a PCHGB 412 signal, such as PCHGB 312 of FIG. 3A, is driven high (disabled) by the control circuitry 102 of FIG. 1, the pre-charge circuit is disabled, allowing a storage cell, such as the six-transistor SRAM cell 200 of FIG. 2 to drive a bit line 416, such as BL0 310 and BL1 311, unimpeded. While PCHGB 412 is disabled, a read word line (RWL) 410, such as WL 214, is driven active by the decoder circuitry 104. Rising edge 440 on RWL 410 results in the storage cell driving bit line BL 416 low, as indicated by falling edge 444, and establishing a low value on BL 416. Following the falling edge 444, column select COLSEL 414, such as ColSel0 320 or ColSel1 324, is asserted high, causing the rdb_lat 420 signal, such as rd_b_lat 330, to be driven high by the selected gated inverter in the column select circuit, leading to rising edge 446. When the COLSEL 414 signal is high, the output latch circuit latches and inverts the value on rdb_lat 420. The output latch circuit generates falling edge 448 while driving output RD 422 low. Importantly, a keeper control signal KPB 424, such as KPB 314, remains in a high state, disabling the bit keeper circuit and allowing higher-performance operation of the high-speed single-ended memory read circuit 300.

At the end of this read operation, the pre-charge signal returns to low with falling-edge 450, which enables the pre-charge circuit. The pre-charge circuit then pulls BL 416 high, as shown by rising edge 452. At this point the high-speed single-ended memory read circuit 300 is ready to perform another operation.

Figure 4B:
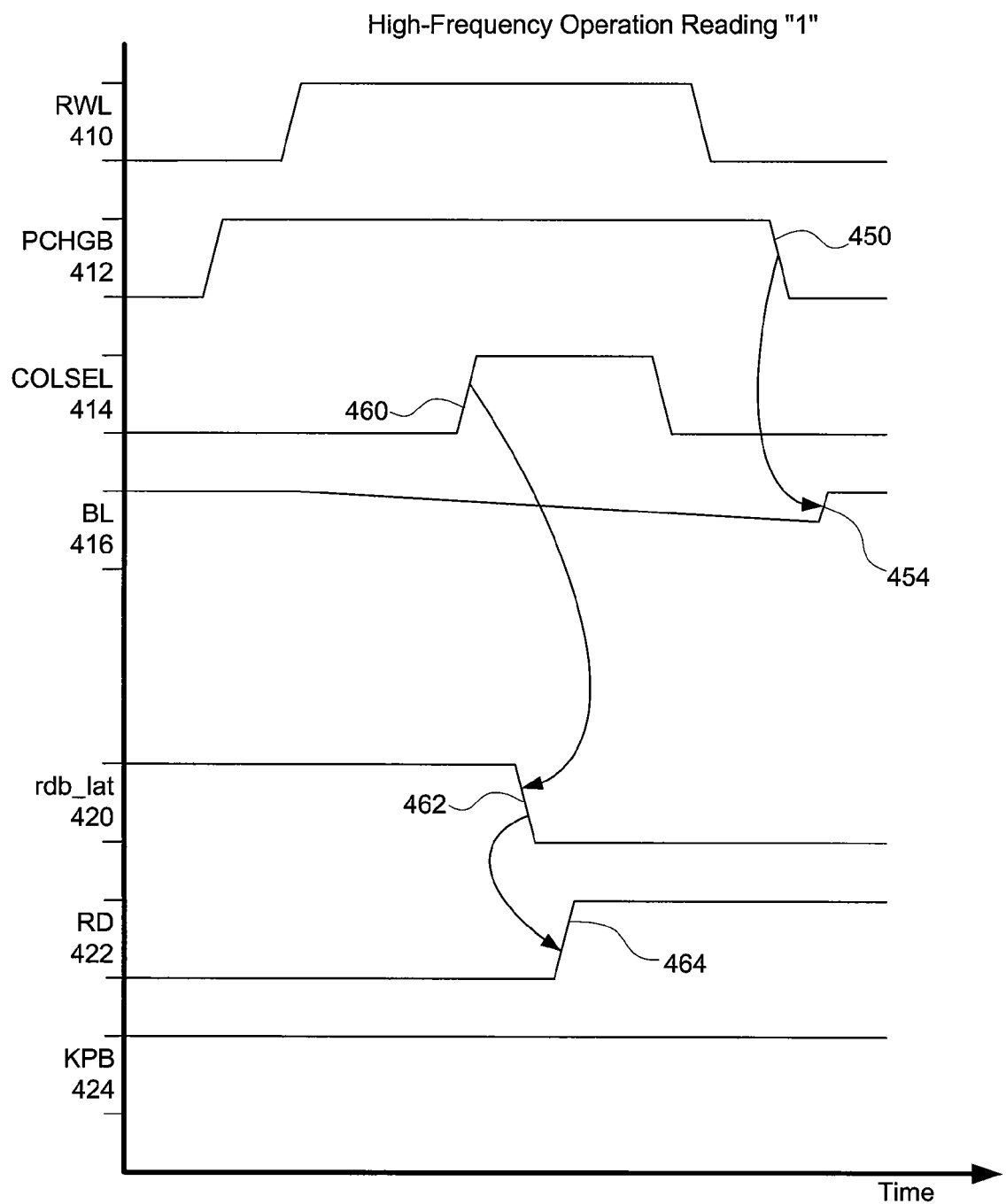
FIG. 4B depicts the operation of the high-speed single-ended memory read circuit operating in high-frequency mode while reading a "1," according to one embodiment of the invention.

FIG. 4B depicts the operation of the high-speed single-ended memory read circuit operating in high-frequency mode while reading a "1," according to one embodiment of the invention. In this scenario, the PCHGB 412, RWL 410, and COLSEL 414 control signals may behave substantially identically to the behavior shown previously in FIG. 4A. However, when the COLSEL 414 signal goes high with rising edge 460, BL is already in a high state from previously being pulled-up. The rising edge 460 then leads to falling edge 462, as the column select circuit drives rdb_lat 420 low along falling edge 462, which causes the output latch circuit to drive RD 422 high along rising edge 464.

During the course of this operation, BL 416 may begin to droop as leakage current pulls BL 416 to ground. At this point, the only source of pull-up is an N-FET in the storage cell. As is well known, conventional F-FETs are inefficient at pulling signals up, and enter sub-threshold drive levels as the drain voltage approaches VDD, effectively preventing the N-FET from holding the drain high. However, when the high-speed single-ended memory read circuit 300 is operating at high operational frequencies, the amount of droop on BL 416 is typically insignificant.

At the end of this read operation, the pre-charge signal returns to low with falling-edge 450, which enables the pre-charge circuit. The pre-charge circuit then pulls BL 416 high, as shown by rising edge 454. At this point, the high-speed single-ended memory read circuit 300 is ready to perform another operation.

Figure 4C:
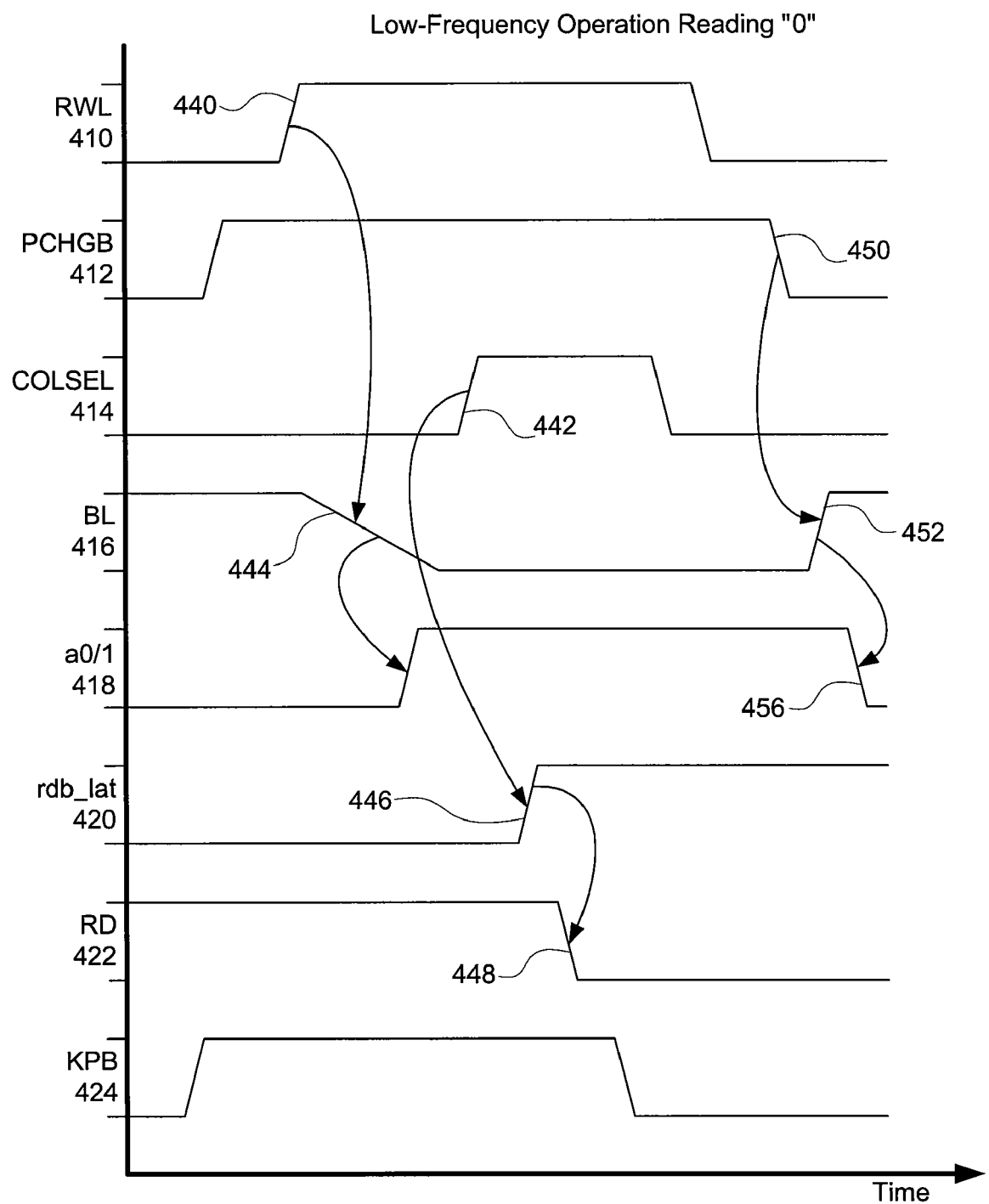
FIG. 4C depicts the operation of the high-speed single-ended memory read circuit operating in low-frequency mode while reading a "0," according to one embodiment of the invention.

FIG. 4C depicts the operation of the high-speed single-ended memory read circuit operating in low-frequency (e.g., 20 MHz) mode while reading a "0," according to one embodiment of the invention. In this scenario, the PCHGB 412, RWL 410, and COLSEL 414 control signals may behave substantially identically to the behavior shown previously in FIG. 4A.

When PCHGB 412 is driven high (disabled) by the control circuitry 102 of FIG. 1, the pre-charge circuit is disabled, allowing a storage cell to drive BL 416 unimpeded. While PCHGB 412 is disabled, RWL 410 is driven active by the decoder circuitry 104. Rising edge 440 on RWL 410 results in the storage cell driving BL 416 low, as indicated by falling edge 444, and establishing a low value on BL 416. Following the falling edge 444, column select COLSEL 414 is asserted high, causing rdb_lat 420 to be driven high by the selected gated inverter within the column select circuit, leading to rising edge 446. When the COLSEL 414 signal is high, the output latch circuit latches and inverts the value on rdb_lat 420. The output latch circuit generates falling edge 448 while driving output RD 422 low. Importantly, KPB 424 pulses to a high state in the beginning of the read operation, temporarily disabling the bit keeper circuit and allowing the high-speed single-ended memory read circuit 300 to read data on BL 416. After a fixed time, KPB 424 goes low, enabling the operation of the bit keeper circuit.

Signal a0/a1 418 depicts the state of either a0 316 or a1 317 of FIG. 3A, depending on which of ColSel0 320 or ColSel1 321 is active during the read operation. When BL 416 goes low, the inverter within the bit keeper circuit associated with the selected bit line drives a0/a1 418 high, disabling the pull-up path from the selected bit line BL 416, to VDD 304 for the duration of time PCHGB 412 is disable and the storage cell is driving BL 416 is low. This effectively prevents the bit keeper circuit from asserting a pull-up effect on BL 416, despite being otherwise enabled by the low state of KPB 424.

At the end of this read operation, the pre-charge signal returns to low with falling-edge 450, which enables the pre-charge circuit. The pre-charge circuit then pulls BL 416 high, as shown by rising edge 452. At this point, the high-speed single-ended memory read circuit 300 is ready to perform another operation.

Figure 4D:
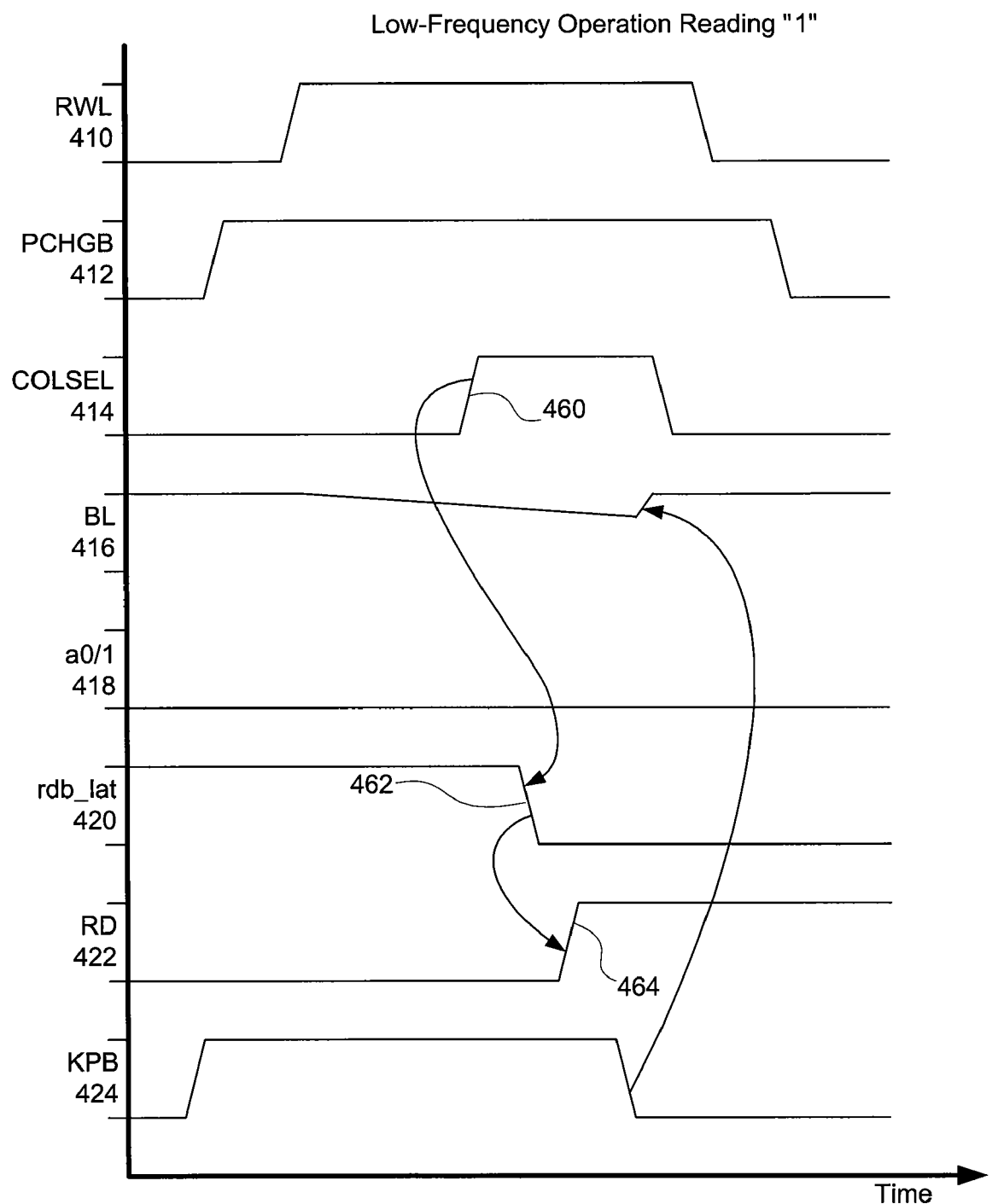
FIG. 4D depicts the operation of the high-speed single-ended memory read circuit operating in low-frequency mode while reading a "1," according to one embodiment of the invention.

FIG. 4D depicts the operation of the high-speed single-ended memory read circuit operating in low-frequency mode while reading a "1," according to one embodiment of the invention.

In this scenario, the PCHGB 412, RWL 410, and COLSEL 414 control signals may behave substantially identically to the behavior shown previously in FIG. 4A. However, when the COLSEL 414 signal goes high with rising edge 460, BL is already in a high state from previously being pulled-up. The rising edge 460 then leads to falling edge 462, as the column select circuit drives rdb_lat 420 low along falling edge 462, which causes the output latch circuit to drive RD 422 high along rising edge 464. Importantly, KPB 424 pulses to a high state in the beginning of the read operation, temporarily disabling the bit keeper circuit and allowing the high-speed single-ended memory read circuit 300 to read data on BL 416. In this case, BL 416 represents a high value within the storage cell. After a fixed time, KPB 424 goes low, enabling the operation of the bit keeper circuit.

During the course of this operation, BL 416 may begin to droop as leakage current pulls BL 416 to ground. At this point, the only source of pull-up is an N-FET in the storage cell. As is well known, conventional F-FETs are inefficient at pulling signals up, and enter sub-threshold drive levels as the drain voltage approaches VDD, effectively preventing the N-FET from holding the drain high. In low-frequency operation, BL 416 may droop substantially without an efficient pull-up, which may cause an error in the current read cycle.

To prevent substantial droop on BL 416, the bit keeper circuit is enabled when an initial high is presented on BL 416 and KPB 424 goes low, enabling the path from BL 416 to VDD for the duration of time KPB 424 is held low. When BL 416 goes high, the inverter within the bit keeper circuit associated with the selected bit line drives a0/a1 418 low, enabling the pull-up path from the selected bit line BL 416, to VDD 304. This effectively prevents BL 416 from drooping for the duration of the read operation.

At the end of this read operation, the pre-charge signal returns to low with falling-edge 450, which enables the pre-charge circuit. The pre-charge circuit then holds BL 416 high in a pre-charge state until the next operation. At this point, the high-speed single-ended memory read circuit 300 is ready to perform another operation.

Figure 5A:
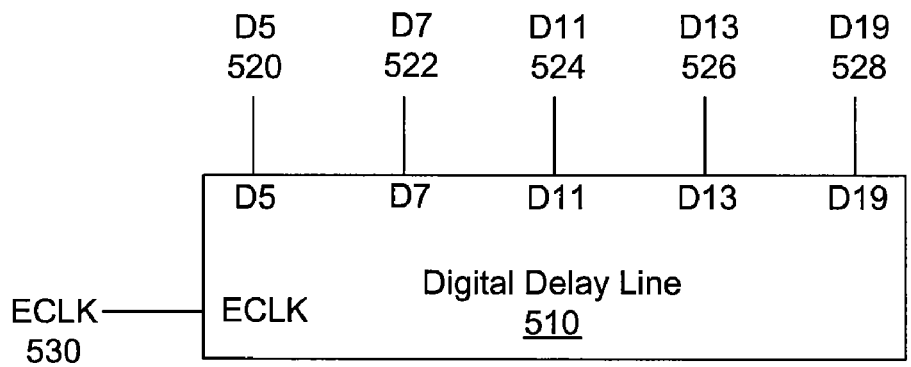
FIG. 5A illustrates a digital delay line configured to generated five delayed outputs, according to one embodiment of the invention.

FIG. 5A illustrates a digital delay line 510 configured to generated five delayed outputs, according to one embodiment of the invention. The digital delay line 510 receives a clock signal ECLK 530 and generates a five delay output D5 520, a seven delay output D7 522, an eleven delay output D11 524, a thirteen delay output D13 526, and a nineteen delay output D19 528.

Figure 5B:
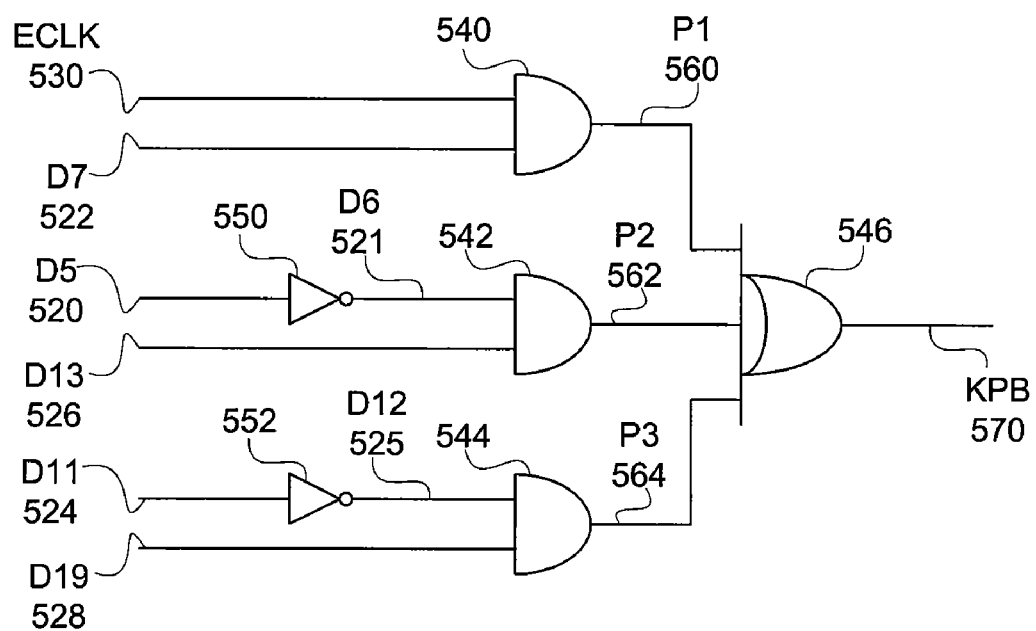
FIG. 5B illustrates a pulse generator circuit configured to generate a keeper control signal (KPB), according to one embodiment of the invention.

FIG. 5B illustrates a pulse generator circuit configured to generate a keeper control signal (KPB 570), according to one embodiment of the invention. In one embodiment, KPB 570 corresponds to KPB 424 of FIGS. 4A-4C. The pulse generator circuit first generates three pulse signals P1 560, P2 562, and P3 564. P1 560 is generated by combining ECLK 530 and D7 522 in AND gate 540. P2 562 is generated by combining D13 526 and D6 521, derived by inverter 550 from D5 520, in AND gate 542. P3 564 is generated by combining D19 528 and D12 525, derived by inverter 552 from D115 524, in AND gate 544. OR gate 546 then combines P1 560, P2 562, and P3 564 to produce KPD 570.

Figure 6A:
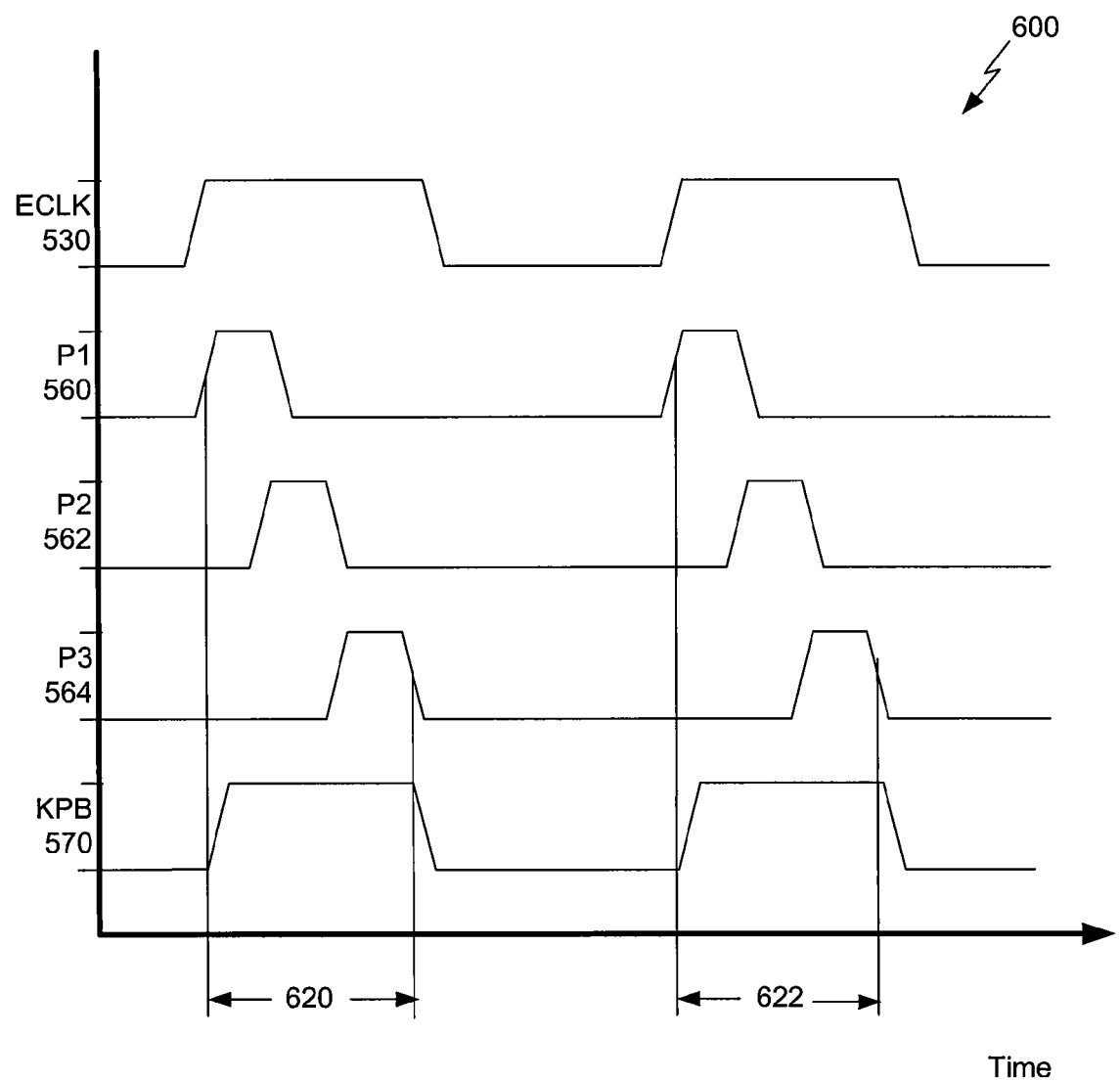
FIG. 6A depicts a set of waveforms that illustrate the generation process of the KPB signal in low-frequency operation, according to one embodiment of the invention.

FIG. 6A depicts a set of waveforms 600 that illustrate the generation process of the KPB signal in low-frequency operation, according to one embodiment of the invention. After each rising edge of ECLK 530, a sequence of one pulse on each of signals P1 560, P2 562, and P3 564 is produced by AND gates 540, 542, and 544, respectively. The three pulses are combined in OR gate 546 to produce a single pulse on KPB 570. At a low operating frequency, the over lap regions 620, 622 derived from the pulses on P1 560, P2 562, and P3 564 are distinct. Each overlap region 620, 622 corresponds to high-going pulse on KPB 570. Subsequent to each high-going pulse, KPB returns low until the next high-going pulse.

Figure 6B:
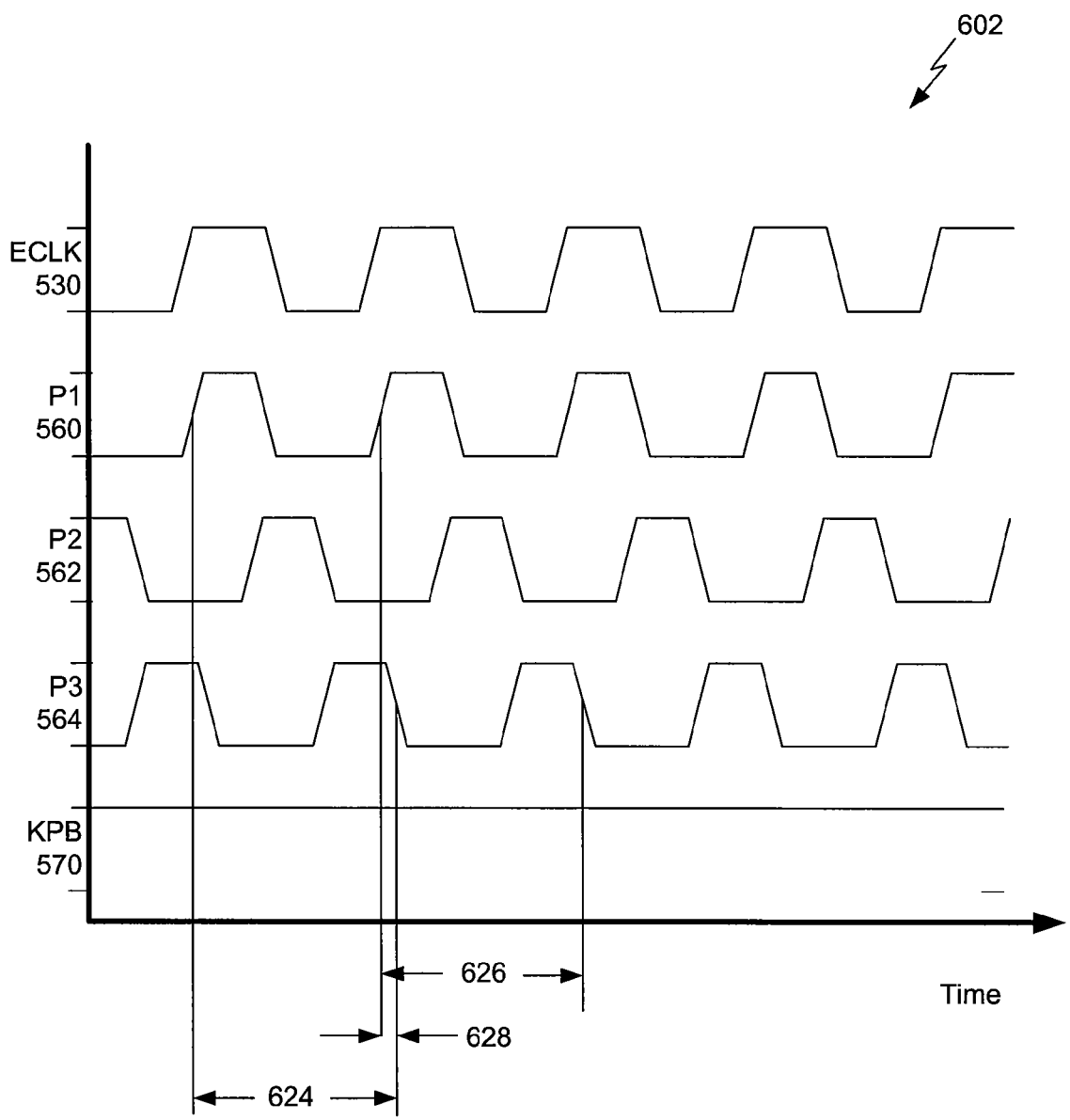
FIG. 6B depicts a set of waveforms that illustrate the generation process of the KPB signal in high-frequency operation, according to one embodiment of the invention.

FIG. 6B depicts a set of waveforms 602 that illustrate the generation process of the KPB signal in high-frequency operation, according to one embodiment of the invention. After each rising edge of ECLK 530, a sequence of one pulse on each of signals P1 560, P2 562, and P3 564 is produced by AND gates 540, 542, and 544, respectively. The three pulses are combined in OR gate 546, producing a constant high signal on KPB 570. At a high operating frequency, the over lap regions 624, 626 derived from the pulses on P1 560, P2 562, and P3 564, actually overlap in time in region 628. As a result of the high frequency applied to ECLK 530, at least one of the signals P1 560, P2 562, and P3 564 is in a high state at all times, meaning OR gate 546 has at least one high input signal at all times. Therefore, OR gate 546 produces a constant high signal on KPB 570.

Figure 7:
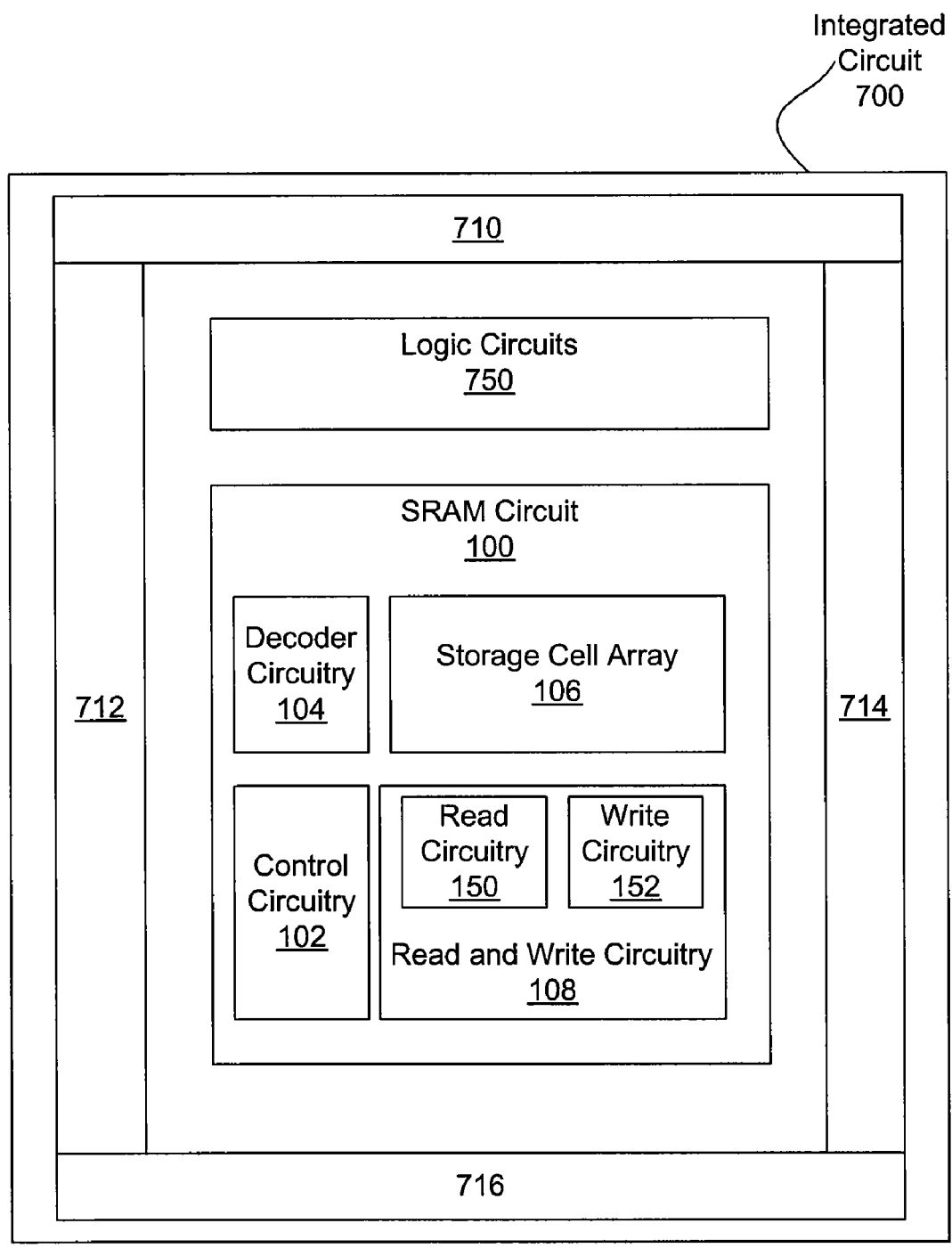
FIG. 7 depicts an integrated circuit, in which one or more aspects of the invention may be implemented.

FIG. 7 depicts an integrated circuit 700, in which one or more aspects of the invention may be implemented. Integrated circuit 700 includes input/output circuits 710, 712, 714 and 716, logic circuits 750, and SRAM circuit 100. The input/output circuits 710, 712, 714 and 716 transmit signals on and off chip. Logic circuits 750 compute logic equations and store certain results. SRAM 100 stores and retrieves data, and includes the control circuitry 102, decoder circuitry 104, storage cell array 106, and read write circuitry 108 described in FIG. 1. The SRAM 100 includes read circuitry 150 and write circuitry 152. The read circuitry 150 includes at least one instance of the high-speed single-ended memory read circuit 300, described in FIGS. 3A-3B.

In one embodiment, the control circuitry 102 includes at least one instance of the digital delay line 510, described in FIG. 5A, and at least one instance of the pulse generator circuit described in FIG. 5B. In an alternative embodiment, the read and write circuitry 108 includes at least one instance of the digital delay line 510, and at least one instance of the pulse generator circuit.

In sum, a high-speed single-ended memory read circuit is disclosed that overcomes certain performance-limiting characteristics of conventional single-ended memory read circuits. Specifically, a bit line keeper control mechanism for a single-ended memory read circuit is introduced to automatically configure a bit line keeper, based on the frequency of a system clock. In high-speed operation, the bit line keeper is disabled, thereby eliminating short-circuit currents related to the bit line keeper and increasing the read performance of the single-ended memory read circuit. In low-speed operation, the bit line keeper is periodically disabled by a timer circuit to enable efficient read or write operations. Subsequent to the read or write operation, the bit line keeper is enabled to preserve state on the bit lines. By selectively enabling the bit line keeper, high-speed performance is improved while preserving correct function at low speeds.

While the forgoing is directed to embodiments of the present invention, other and further embodiments of the invention may be devised without departing from the basic scope thereof. For example, aspects of the present invention may be implemented in complementary symmetry metal-oxide semiconductor (CMOS) fabrication technology or other related fabrication technologies. Therefore, the scope of the present invention is determined by the claims that follow.

We claim:

1. A single-ended memory read circuit configured to operate in a first mode or in a second mode, comprising:
    a pre-charge circuit configured to pull up a first bit line and a second bit line in response to a pre-charge control signal;
    a bit keeper circuit configured to maintain a high state whenever the first bit line or the second bit line is in a high state, wherein the bit keeper is disabled when the single-ended memory circuit operates in the first mode and the bit keeper circuit is periodically disabled by a timer circuit when the single-ended memory circuit operates in the second mode; and
    a column select circuit configured to select either the first bit line or the second bit line to drive an output node located within the column select circuit to produce a single bit of read data.

2. The memory read circuit of claim 1, wherein the pre-charge circuit includes a first p-channel field effect transistor (P-FET) configured to provide a first pull-up path from the first bit line to a voltage supply.

3. The memory read circuit of claim 2, wherein the pre-charge circuit includes a second P-FET configured to provide a second pull-up path from the second bit line to the voltage supply.

4. The memory read circuit of claim 3, wherein the bit keeper circuit includes a third P-FET, a fourth P-FET and a first inverter configured to provide a third pull-up path from the first bit line to the voltage supply.

5. The memory read circuit of claim 4, wherein the bit keeper circuit includes a fifth P-FET, a sixth P-FET and a second inverter configured to provide a fourth pull-up path from the second bit line to the voltage supply.

6. The memory read circuit of claim 5, wherein the third pull-up path is enabled by a low bit keeper control signal when the first bit line is in a high state.

7. The memory read circuit of claim 6, wherein the first bit line is pulled up to the voltage supply when the third pull-up path is enabled.

8. The memory read circuit of claim 5, wherein the fourth pull-up path is enabled by low bit keeper control signal when the second bit line is in a high state.

9. The memory read circuit of claim 8, wherein the second bit line is pulled up to the voltage supply when the fourth pull-up path is enabled.

10. The memory read circuit of claim 5, wherein the column select circuit includes a third inverter and a first gated inverter configured to drive the output node with an inverted representation of a first bit line signal in response to a first column select signal having a high value.

11. The memory read circuit of claim 10, wherein the column select circuit includes a fourth inverter and a second gated inverter configured to drive the output node with an inverted representation of a second bit line signal in response to a second column select signal having a high value.

12. The memory read circuit of claim 11, further comprising an output latch circuit configured to latch a value associated with the output node.

13. The memory read circuit of claim 12, wherein the output latch circuit is further configured to generate an inverted representation of the latched value.

14. The memory read circuit of claim 13, wherein the output latch circuit includes a first n-channel field effect transistor (N-FET), a second N-FET, a third N-FET and a fifth inverter configured to pull down the output node to a low state in response to the first column select signal and the second column select signal being in low states.

15. The memory read circuit of claim 14, wherein the output latch circuit includes a seventh P-FET, an eighth P-FET and a ninth P-FET configured to pull up the output node, in combination with the fifth inverter, to the voltage supply in response to the first column select signal and the second column select signal being in low states.

16. The memory read circuit of claim 1, wherein the bit keeper circuit is driven by a bit keeper control signal produced by a pulse generator circuit.

17. The memory read circuit of claim 1, wherein the memory read circuit operates at a higher frequency in the first mode than in the second mode.

18. The memory read circuit of claim 1, wherein the bit keeper circuit is enabled prior to a read operation or a write operation when the memory read circuit operates in the second mode.

19. An integrated circuit, comprising:
    logic circuits; and
    a memory circuit coupled to the logic circuits and including a single-ended memory read circuit configured to operate in a first mode or in a second mode, having:
        a pre-charge circuit configured to pull up a first bit line and a second bit line in response to a pre-charge control signal,
        a bit keeper circuit configured to maintain a high state whenever the first bit line or the second bit line is in a high state, wherein the bit keeper is disabled when the single-ended memory circuit operates in the first mode and the bit keeper circuit is periodically disabled by a timer circuit when the single-ended memory circuit operates in the second mode, and a column select circuit configured to select either the first bit line or the second bit line to drive an output node located within the column select circuit to produce a single bit of read data.

20. The integrated circuit of claim 19, wherein the bit keeper circuit includes a third P-FET, a fourth P-FET and a first inverter configured to provide a third pull-up path from the first bit line to the voltage supply, and a fifth P-FET, a sixth P-FET and a second inverter configured to provide a fourth pull-up path from the second bit line to the voltage supply.

21. The integrated circuit of claim 20, wherein the third pull-up path is enabled by a low bit keeper control signal when the first bit line is in a high state, and the fourth pull-up path is enabled by a low bit keeper control signal when the second bit line is in a high state.

22. The integrated circuit of claim 21, wherein the first bit line is pulled up to the voltage supply when the third pull-up path is enabled, and the second bit line is pulled up to the voltage supply when the fourth pull-up path is enabled.

23. The integrated circuit of claim 19, wherein the memory read circuit operates at a higher frequency in the first mode than in the second mode.

24. The integrated circuit of claim 19, wherein the bit keeper circuit is enabled prior to a read operation or a write operation when the memory read circuit operates in the second mode.

* * * * *